(12) United States Patent
Lin et al.

(10) Patent No.: US 12,176,703 B2
(45) Date of Patent: Dec. 24, 2024

(54) TERMINAL PROTECTION NETWORK AND ELECTRONIC DEVICE

(71) Applicant: INNOSCIENCE (SUZHOU) SEMICONDUCTOR CO., LTD., Suzhou (CN)

(72) Inventors: Yiming Lin, Suzhou (CN); Jianjian Sheng, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/920,801

(22) PCT Filed: Mar. 4, 2022

(86) PCT No.: PCT/CN2022/079244
§ 371 (c)(1),
(2) Date: Oct. 24, 2022

(87) PCT Pub. No.: WO2023/164919
PCT Pub. Date: Sep. 7, 2023

(65) Prior Publication Data
US 2024/0222964 A1 Jul. 4, 2024

(51) Int. Cl.
*H02H 9/04* (2006.01)
*H01L 27/02* (2006.01)
(52) U.S. Cl.
CPC ......... *H02H 9/046* (2013.01); *H01L 27/0255* (2013.01); *H01L 27/0266* (2013.01); *H01L 27/0288* (2013.01)

(58) Field of Classification Search
CPC . H02H 9/046; H01L 27/0255; H01L 27/0266; H01L 27/0288
See application file for complete search history.

(56) References Cited

U.S. PATENT DOCUMENTS

| | | | |
|---|---|---|---|
| 2002/0084490 A1* | 7/2002 | Ker | H01L 27/0292 438/200 |
| 2007/0070562 A1* | 3/2007 | Ma | H03F 3/605 361/56 |

(Continued)

FOREIGN PATENT DOCUMENTS

| | | |
|---|---|---|
| CN | 104242285 A | 12/2014 |
| CN | 104253126 A | 12/2014 |

(Continued)

OTHER PUBLICATIONS

International Search Report and Written Opinion of the corresponding PCT application No. PCT/CN2022/079244 mailed on Sep. 27, 2022.

*Primary Examiner* — Scott Bauer
(74) *Attorney, Agent, or Firm* — Li & Cai Intellectual Property (USA) Office

(57) ABSTRACT

A terminal protection network, which comprises one or more terminal protection circuits (204, 206, 208), each having at least two terminals (T1, T2) connected respectively to at least two of three terminals (T1, T2, T3) of a primary component (202) in the electronic device; and one or more clamping circuits (240_1, . . . , 240_N), each having two terminals (T1, T2) connected respectively to the primary component (202) and a corresponding auxiliary component (220_1, . . . , 220_N) in the electronic device.

18 Claims, 17 Drawing Sheets

(56) References Cited

U.S. PATENT DOCUMENTS

| | | | |
|---|---|---|---|
| 2008/0239599 A1* | 10/2008 | Yizraeli | ........... H02H 9/046 361/56 |
| 2013/0272045 A1 | 10/2013 | Soeiro et al. | |
| 2017/0263598 A1* | 9/2017 | Arai | ........... H01L 27/0255 |
| 2019/0273488 A1* | 9/2019 | Reiter | ........... H02H 7/222 |
| 2020/0365581 A1 | 11/2020 | Guan et al. | |
| 2021/0210481 A1 | 7/2021 | Guan et al. | |

FOREIGN PATENT DOCUMENTS

| | | | |
|---|---|---|---|
| CN | 107017611 A | 8/2017 | |
| CN | 109286181 A | 1/2019 | |
| CN | 111192872 A | 5/2020 | |
| CN | 112740498 A | 4/2021 | |
| JP | 2011101152 A | 5/2011 | |

* cited by examiner

TERMINAL PROTECTION NETWORK AND ELECTRONIC DEVICE

FIELD OF THE INVENTION

The present invention generally relates to an electronic device with an terminal protection network. More specifically, the present invention relates to an III-V compound electronic device with a terminal protection network.

BACKGROUND OF THE INVENTION

Direct bandgap material, for example an III-V compound have been widely used for high-power and high-frequency devices because of low power losses and fast switching transition in comparison with silicon metal oxide semiconductor materials. For example, gallium nitride GaN has been widely used in making primary components in fast chargers for mobile devices. As III-V compound-based transistors are vulnerable to high voltage damages such as electrostatic discharges (ESD), a III-V compound-based electronic device may require individual terminal protection circuit for each of its terminals. Therefore, circuit complexity and chip area will be increased significantly with the increase in number of terminals.

SUMMARY OF THE INVENTION

One objective of the present invention is to provide a cost-effective approach of terminal protection for III-V compound-based electronic device.

In according with one aspect of the present disclosure, a terminal protection network is provided. The terminal protection network comprises one or more terminal protection circuits, each having at least two terminals connected respectively to at least two of three terminals of a primary component in an electronic device; and one or more clamping circuits, each having two terminals connected respectively to the primary component and a corresponding auxiliary component in the electronic device.

In accordance with another aspect of the present disclosure, an electronic device is provided. The electronic device comprises: a control terminal; a first conduction terminal; a second conduction terminal; and one or more auxiliary conduction terminals; a primary component having three terminals including a first terminal connected to the control terminal, a second terminal connected to the first conduction terminal and a third terminal connected to the second conduction terminal; one or more auxiliary components, each having three terminals including a first terminal connected to the control terminal, a second terminal connected to the first conduction terminal and a third terminal connected to a corresponding auxiliary conduction terminal; a terminal protection network for protecting the primary component and the one or more auxiliary components. The terminal protection network comprises: one or more terminal protection circuits, each having at least two terminals connected to at least two of three terminals of the primary component respectively; and one or more clamping circuits, each having a first terminal connected to the second conduction terminal and a second terminal connected to a corresponding auxiliary conduction terminal.

By implementing the terminal protection network in the electronic device, the terminal protection circuits can be shared among a plurality of terminals of the electronic device. As clamping circuits in general have less component and occupy less area in comparison with the terminal protection circuits, the present invention provides a more cost-effective terminal protection approach.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. For simplicity, common reference numerals may be used throughout the drawings and the detailed description to indicate the same or similar components. Internal terminals inside the relevant components/circuit/blocks will be denoted with the same labels, such as "T1", "T2", "T3".

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1:
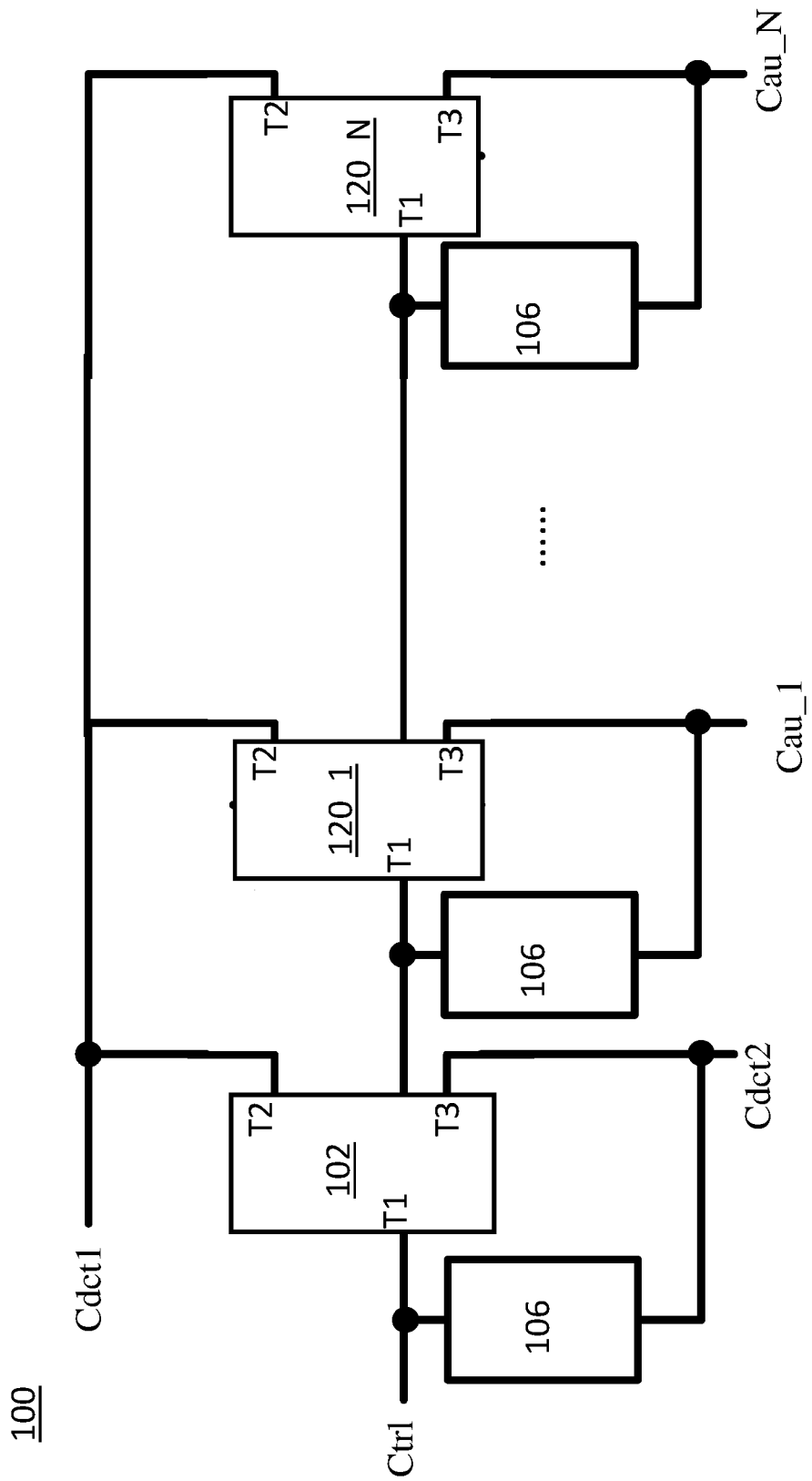
FIG. 1 shows a circuit block diagram for an electronic device according to a comparative embodiment of the present invention.

FIG. 1 is a circuit block diagram for an electronic device 100 according to a comparative embodiment of the present invention. As shown in FIG. 1, the electronic device 200 may comprise a control terminal Ctrl; a conduction terminal Cdct1; a conduction terminal Cdct2; and one or more auxiliary conduction terminals Cau_1, . . . Cau_N, where N is the number of auxiliary conduction terminals.

The electronic device 100 may further comprise a primary component 102 having three terminals including a terminal T1 connected to the control terminal, a terminal T2 connected to the conduction terminal Cdct1 and a terminal T3 connected to the conduction terminal Cdct2.

The electronic device 100 may further comprise one or more auxiliary components 120_1, . . . , 120_N, each having three terminals including a terminal T1 connected to the control terminal, a terminal T2 connected to the conduction terminal Cdct1 and a terminal T3 connected to a corresponding auxiliary conduction terminal Cau_1, . . . , Cau_N. Each of the primary component 102 and the one or more auxiliary components 1201, . . . , 120_N is protected from ESD damages by an terminal protection circuit 106. It can be seen that with the number of auxiliary components increase, the number of individual terminal protection circuits increases and leads to a significant increase in circuit complexity and chip area.

Figure 2:
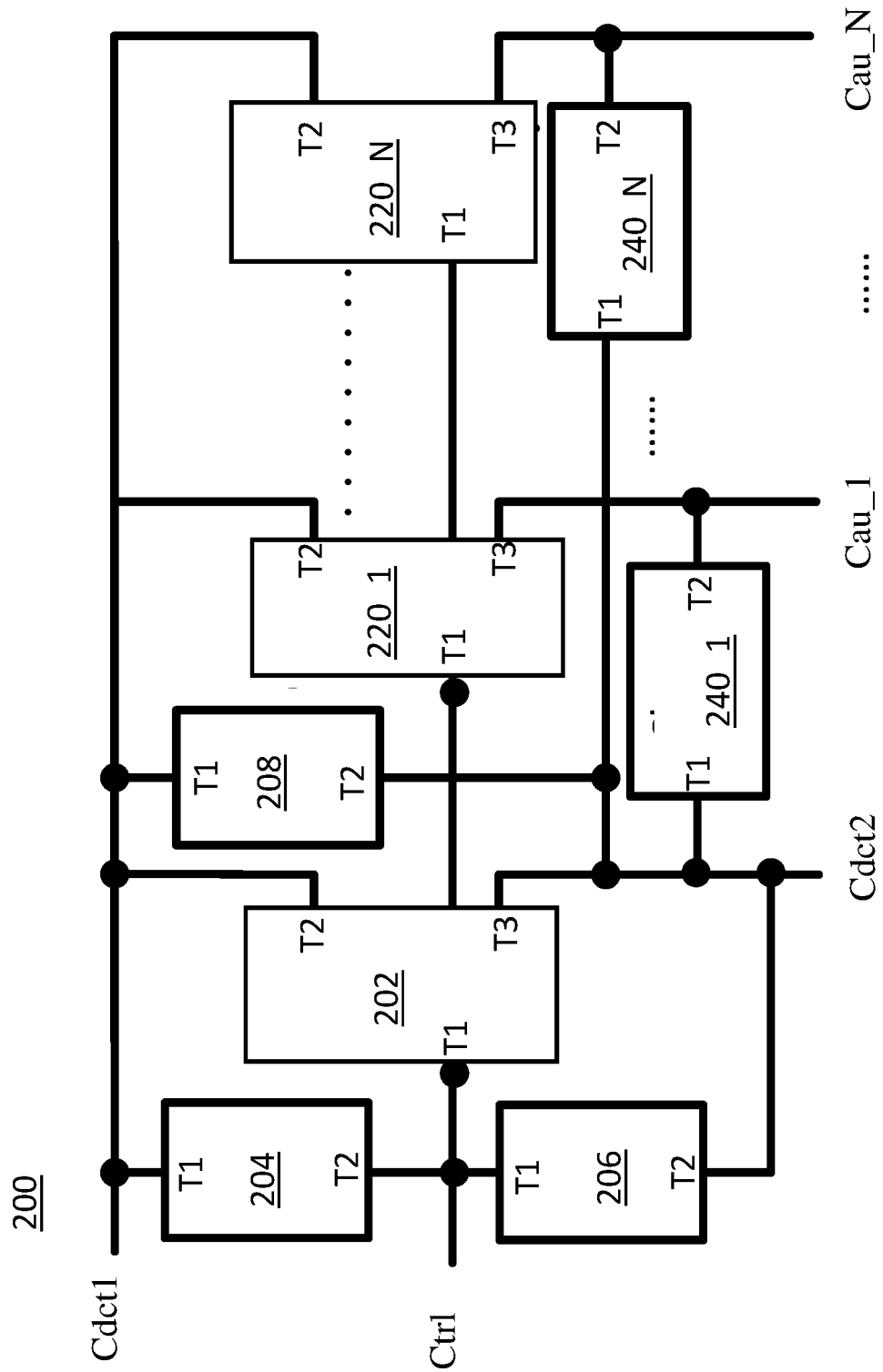
FIG. 2 shows a circuit block diagram for an electronic device according to some embodiments of the present invention.

FIG. 2 is a circuit block diagram for an electronic device 200 according to some embodiments of the present invention. As shown in FIG. 2, the electronic device 200 may comprise a control terminal Ctrl; a conduction terminal Cdct1; a conduction terminal Cdct2; and one or more auxiliary conduction terminals Cau_1, . . . Cau_N, where N is the number of the auxiliary conduction terminals.

The electronic device 200 may comprise a primary component 202 having three terminals including a terminal T1 connected to the control terminal, a terminal T2 connected to the conduction terminal Cdct1 and a terminal T3 connected to the conduction terminal Cdct2.

The electronic device 200 may further comprise one or more auxiliary components 220_1, . . . , 220_N, each having three terminals including a terminal T1 connected to the control terminal, a terminal T2 connected to the conduction terminal Cdct1 and a terminal T3 connected to a corresponding auxiliary conduction terminal.

In some embodiments, the primary component 202 and all of the auxiliary components may work as power devices. In some embodiments, the primary component 202 may work as a power device and each of the one or more auxiliary components 220_1, . . . , 220_N may work as a current sensing device.

The electronic device 200 may further comprise an terminal protection network for protecting the primary component and the one or more auxiliary components 220_1, . . . , 220_N. The terminal protection network may comprise one or more terminal protection circuits each having at least two terminals connected respectively to at least two of three terminals of the primary component.

The terminal protection network may further comprise one or more clamping circuits 240_1, . . . , 240_N, each having two terminals connected respectively to the primary component and a corresponding auxiliary component.

In some embodiments, the terminal protection network may comprise an terminal protection circuit 204 having a terminal T1 connected to the conduction terminal Cdct1 and a terminal T2 connected to the control terminal Ctrl.

In some embodiments, the terminal protection network may comprise an terminal protection circuit 206 having a terminal T1 connected to the control terminal Ctrl and a terminal T2 connected to the conduction terminal Cdct2.

In some embodiments, the terminal protection network may comprise an terminal protection circuit 208 having a terminal T1 connected to the conduction terminal Cdct1 and a terminal T2 connected to the conduction terminal Cdct2.

In some embodiments, each clamping circuits 240_1, . . . , 240_N may have a terminal T1 connected to the conduction terminal Ccdt2 (that is connected to the terminal T3 of the primary component 202 and the terminal T2 of the terminal protection circuit 206); and a terminal T2 connected to a terminal T3 of a corresponding auxiliary component (that is, connected to a corresponding auxiliary conduction terminal).

Figure 3:
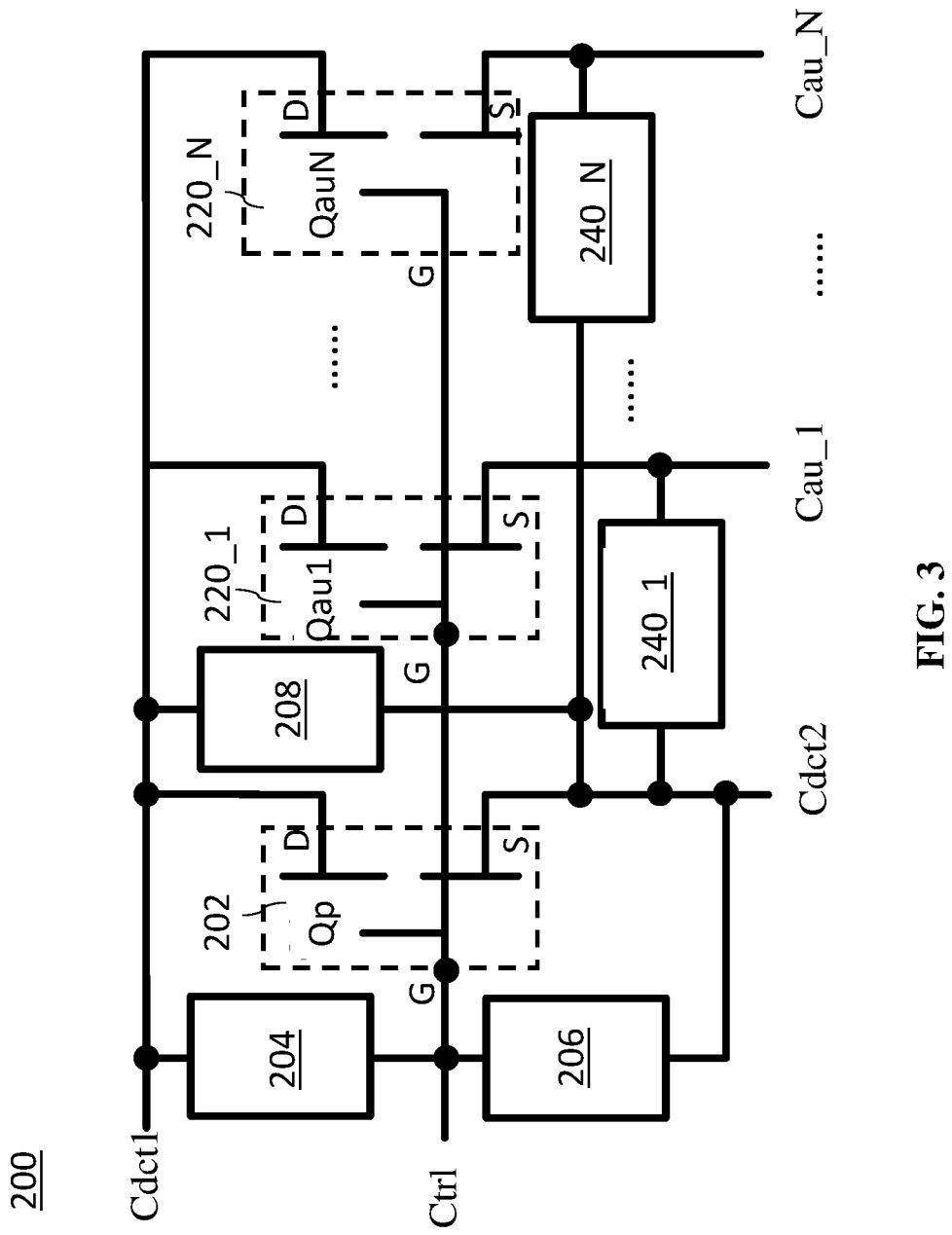
FIG. 3 shows a more detailed circuit diagram for the electronic device of FIG. 2.

Referring to FIG. 3. In some embodiments, the primary component 202 may be a power transistor Qp having a gate G acting as the terminal of the primary component, a drain D acting as the terminal T2 of the primary component and a source S acting as the terminal T3 of the primary component. In some embodiments, the primary component 202 may be a horizontal/transverse high-electron-mobility transistor HEMT. In some embodiments, the primary component 202 may include an arbitrary quantity of horizontal/transverse HEMTs or any other power circuits.

In some embodiments, each of the auxiliary components 220_1, . . . , 220_N may be an auxiliary transistor Qau1, . . . , QauN having a gate G acting as the terminal of the auxiliary component, a drain D acting as the terminal T2 of the auxiliary component and a source S acting as the terminal T3 of the auxiliary component. In some embodiments, each of the auxiliary components may be a horizontal/transverse high-electron-mobility transistor HEMT. In some embodiments, each of the auxiliary components may include an arbitrary quantity of horizontal/transverse HEMTs or any other current sensing circuits.

Referring to FIGS. 4A-4B and 5A-5B. In some embodiments, each of the clamping circuits 204_1, . . . , 204_N may comprise a pair of rectifier $F_{C1}$ and rectifier $F_{C2}$ connected in anti-parallel between the terminal T1 and terminal T2 of the clamping circuit.

Figure 4A:
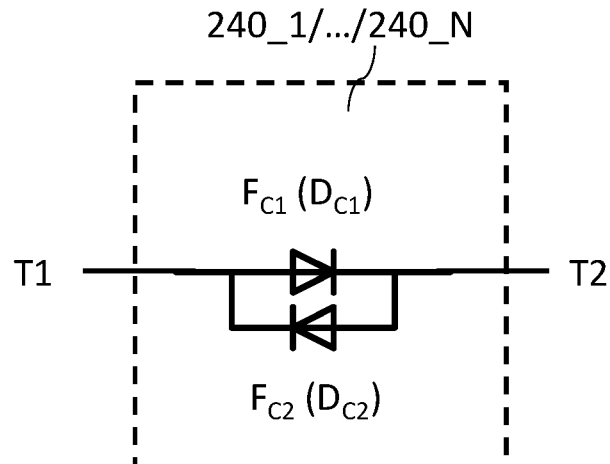
FIG. 4A shows an example of clamping circuit according to some embodiments of the present invention.

Referring to FIG. 4A. In some embodiments, the rectifier $F_{C1}$ may comprise a diode $D_{C1}$ having an anode connected to the terminal T1 of the clamping circuit and a cathode connected to the terminal T2 of the clamping circuit. The rectifier $F_{C2}$ may comprise a diode $D_{C2}$ having an anode connected to the terminal T2 of the clamping circuit and a cathode connected to the terminal T1 of the clamping circuit.

Figure 4B:
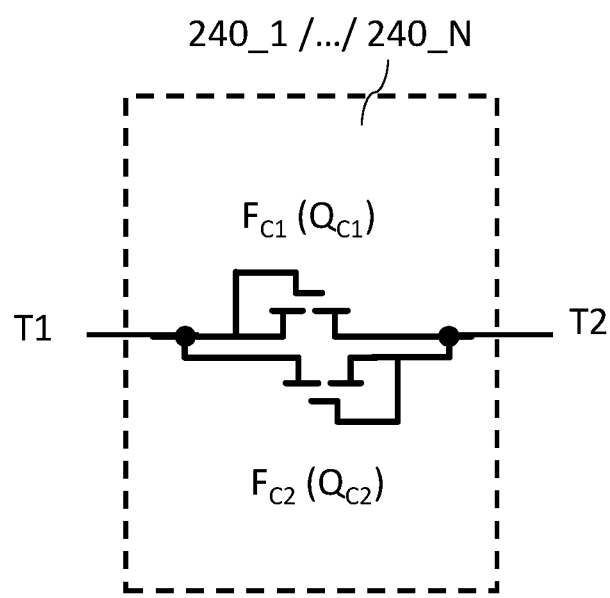
FIG. 4B shows an example of clamping circuit according to some embodiments of the present invention.

Referring to FIG. 4B. In some embodiments, the diode $D_{C1}$ may be constituted (or replaced) with a transistor $Q_{C1}$ having a source and a gate electrically shorted together to act as the anode of the diode $D_{C1}$ and a drain to act as the cathode of the diode $D_{C1}$. The diode $D_{C2}$ may be constituted (or replaced) with a transistor $Q_{C2}$ having a source and a gate electrically shorted together to act as the anode of the diode $D_{C2}$ and a drain to act as the cathode of the diode $D_{C2}$.

In other words, the rectifier $F_{C1}$ may comprise a transistor $Q_{C1}$. The transistor $Q_{C1}$ has a source and a gate electrically shorted together and connected to the terminal T1 of the clamping circuit. The transistor $Q_{C1}$ has a drain connected to the terminal T2 of the clamping circuit. The rectifier $F_{C2}$ may comprise a transistor $Q_{C2}$. The transistor $Q_{C2}$ has a source and a gate electrically shorted together and connected to the terminal T2 of the clamping circuit. The transistor $Q_{C2}$ has a drain connected to the terminal T1 of the clamping circuit.

Figure 5A:
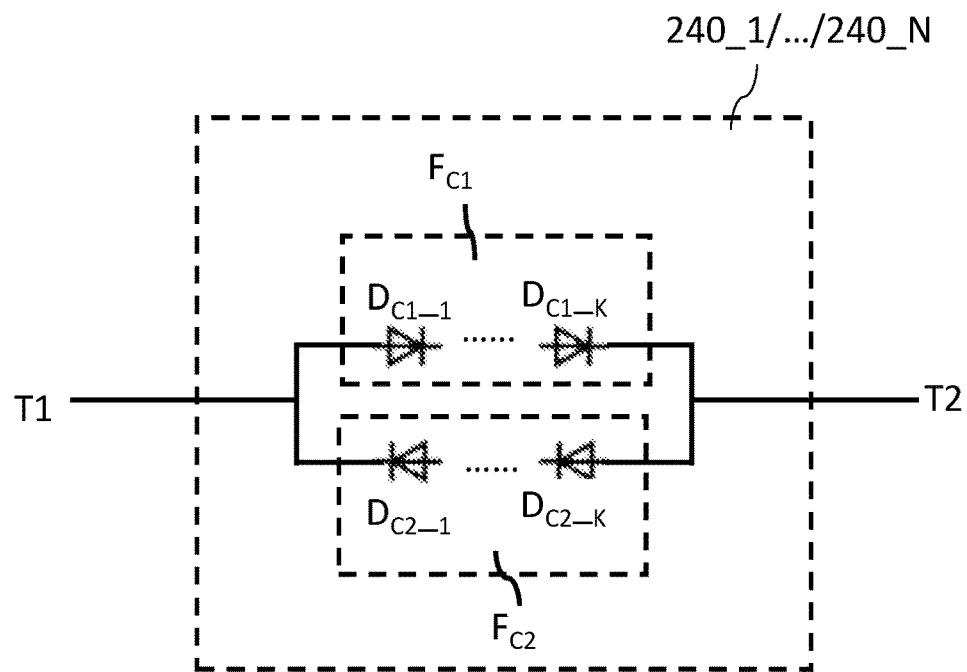
FIG. 5A shows an example of clamping circuit according to some embodiments of the present invention.

Referring to FIG. 5A. In some embodiments, the rectifier $F_{C1}$ may comprise a plurality of diodes $D_{C1\_1}, \ldots, D_{C1\_K}$ connected in series, where K is the number of the plurality of diodes $D_{C1}$. The plurality of diodes $D_{C1\_1}, \ldots, D_{C1\_K}$ include a first member diode $D_{C1\_1}$ having an anode connected to the terminal T1 of the clamping circuit and a last member diode $D_{C1\_K}$ having a cathode connected to the terminal T2 of the clamping circuit. The rectifier $F_{C2}$ may comprise a plurality of diodes $D_{C2\_1}, \ldots, D_{C2\_K}$ connected in series, where K is the number of the plurality of diodes $D_{C2}$. The plurality of diodes $D_{C2\_1}, \ldots, D_{C2\_K}$ include a first member diode $D_{C2\_1}$ having an anode connected to the terminal T2 of the clamping circuit and a last member diode $D_{C2\_K}$ having a cathode connected to the terminal T1 of the clamping circuit.

Figure 5B:
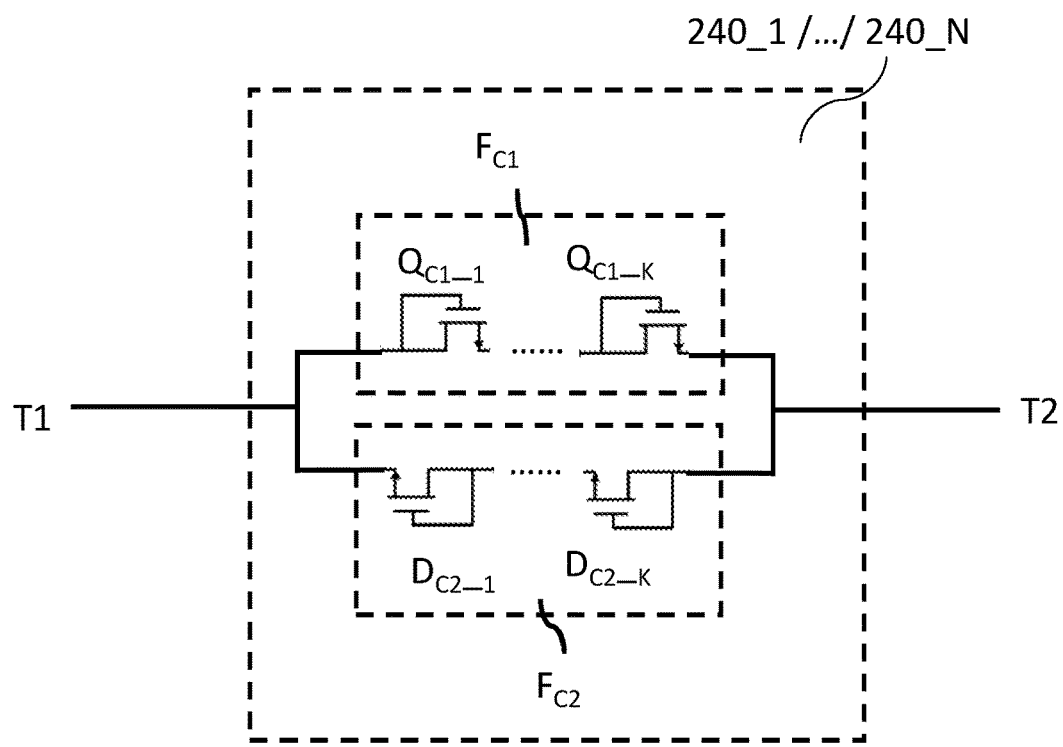
FIG. 5B shows an example of clamping circuit according to some embodiments of the present invention.

Referring to FIG. 5B. In some embodiments, each of the plurality of diodes $D_{C1\_1}, \ldots D_{C1\_M}$ may be constituted (or replaced) with a transistor having a source and a gate electrically shorted together to act as the anode of the diode and a drain to act as the cathode of the diode. Each of the plurality of diodes $D_{C2\_1}, \ldots, D_{C2\_K}$ may be constituted (or replaced) with a transistor $Q_{C2\_1}/\ldots/Q_{C2\_K}$ having a source and a gate electrically shorted together to act as the anode of the diode and a drain to act as the cathode of the diode.

In other words, the rectifier $F_{C1}$ may comprise a plurality of transistor $Q_{C1\_1}, \ldots, Q_{C1\_K}$. Each of the transistors $Q_{C1\_1}, \ldots, Q_{C1\_K}$ has a source and a gate electrically shorted together. The plurality of transistor $Q_{C1\_1}, \ldots, Q_{C1\_K}$ are connected in series. The plurality of transistor $Q_{C1\_1}, \ldots, Q_{C1\_K}$ include a first member transistor $Q_{C1\_1}$ having a source and a gate connected to the terminal T1 of the clamping circuit and a last member transistor $Q_{C1\_K}$ having a drain connected to the terminal T2 of the clamping circuit. The rectifier $F_{C2}$ may comprise a plurality of transistor $Q_{C2\_1}, \ldots, Q_{C2\_K}$. Each of the transistors $Q_{C2\_1}, \ldots, Q_{C2\_K}$ has a source and a gate electrically shorted together. The plurality of transistor $Q_{C2\_1}, \ldots, Q_{C2\_K}$ are connected in series. The plurality of transistor $Q_{C2\_1}, \ldots, Q_{C2\_K}$ include a first member transistor $Q_{C2\_1}$ having a source and a gate connected to the terminal T2 of the clamping circuit and a last member transistor $Q_{C2\_K}$ having a drain connected to the terminal T1 of the clamping circuit.

FIGS. 6A-6D show circuit operation modes of an exemplary terminal protection network when an ESD event occurs or under a ESD test. For simplicity, only one terminal protection circuit 106 and one clamping circuit 140_1 are shown to illustrate the operation.

Figure 6A:
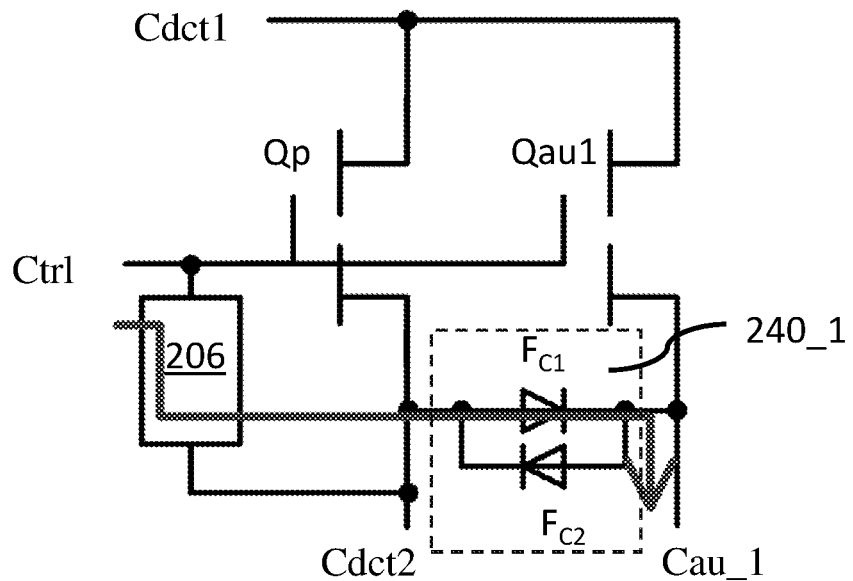
FIGS. 6A-6D show circuit operation modes of the terminal protection network when an ESD event occurs or under a ESD test.

As shown in FIG. 6A, when electrostatic charges are accumulated or borne between the control terminal Ctrl and the auxiliary conduction terminal Cau_1 so that the voltage at the control terminal Ctrl is higher than that at the auxiliary conduction terminal Cau_1, the electrostatic charges can be discharged through a path along the terminal protection circuit 106 and the rectifier $F_{C1}$ in the clamping circuit 240_1.

Figure 6B:
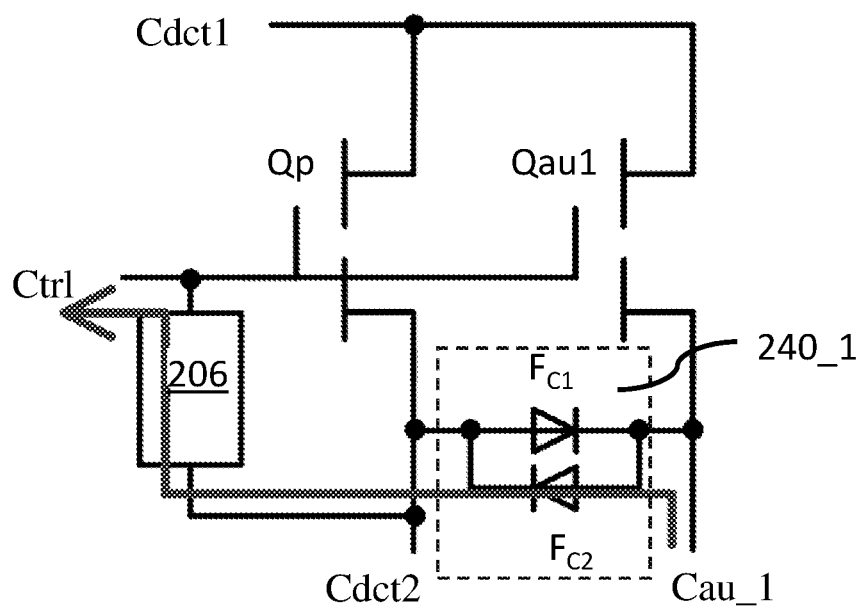

As shown in FIG. 6B, when electrostatic charges are accumulated or borne between the control terminal Ctrl and the auxiliary conduction terminal Cau_1 so that the voltage at the control terminal Ctrl is lower than that at the auxiliary conduction terminal Cau_1, the electrostatic charges can be discharged through a path along the rectifier $F_{C2}$ in the clamping circuit 240_1 and the terminal protection circuit 106.

Figure 6C:
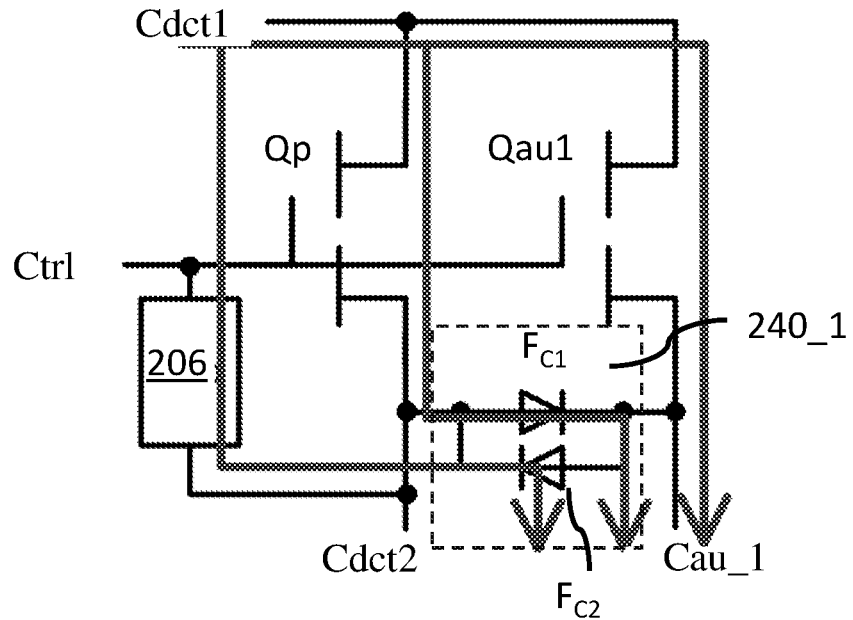

As shown in FIG. 6C, when electrostatic charges are accumulated or borne between the conduction terminal Cdct1 and the auxiliary conduction terminal Cau_1 so that the voltage at the conduction terminal Cdct1 is higher than that at the auxiliary conduction terminal Cau_1, the electrostatic charges can be discharged through a plurality of paths. The plurality of paths includes a first path through a drain-to-gate junction of the power transistor Qp, the terminal protection circuit 106 and the rectifier $F_{C1}$ in the clamping circuit 240_1; a second path through a drain-to-source junction of the power transistor Qp and the rectifier $F_{C1}$ in the clamping circuit 240_1; and a third path through the auxiliary transistor Qau1. As the electrostatic charges can be partially discharged through the rectifier $F_{C1}$ in the clamping circuit 240_1, the power transistor Qp and the auxiliary transistor Qau1 can be protected.

Figure 6D:
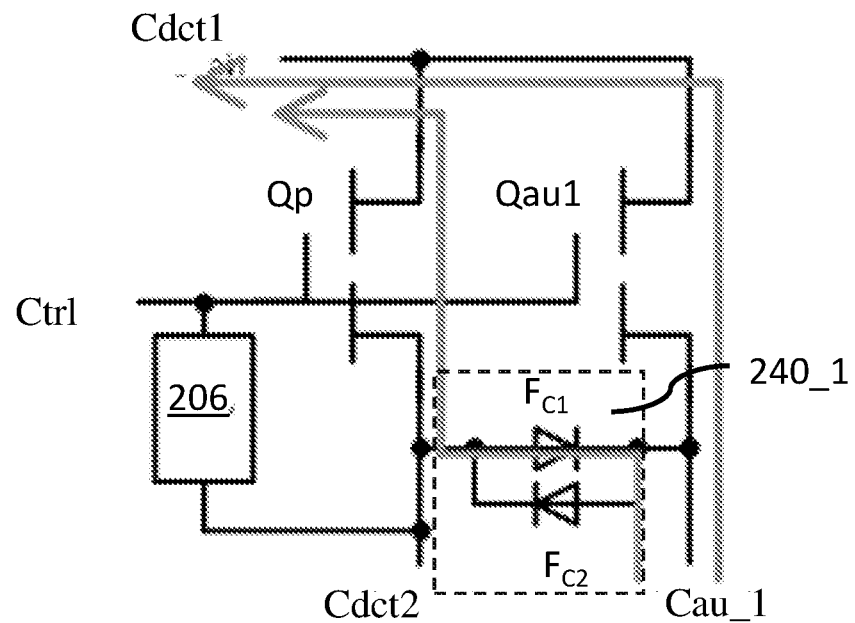

As shown in FIG. 6D, when electrostatic charges are accumulated or borne between the conduction terminal Cdct1 and the auxiliary conduction terminal Cau_1 so that the voltage at the conduction terminal Cdct1 is lower than that at the auxiliary conduction terminal Cau_1, the electrostatic charges can be discharged through a plurality of paths. The plurality of paths includes a first path through the rectifier $F_{C2}$ in the clamping circuit 240_1 and a source-to-drain junction of the power transistor Qp; and a second path through the auxiliary transistor Qau1. As the electrostatic charges can be partially discharged through the rectifier $F_{C2}$ in the clamping circuit 240_1, the power transistor Qp and the auxiliary transistor Qau1 can be protected.

Figure 7A:
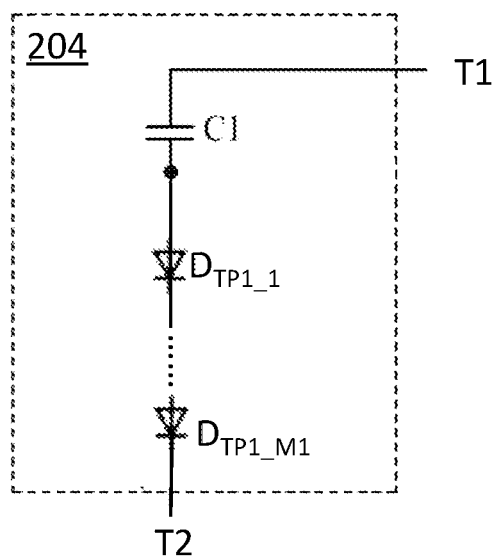
FIG. 7A shows an example of terminal protection circuit according to some embodiments of the present invention.
Figure 7B:
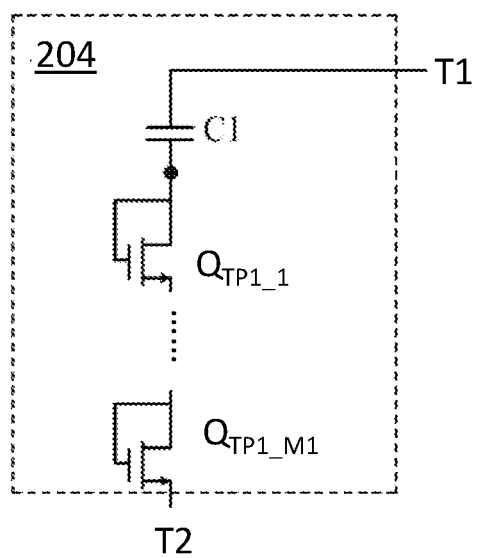
FIG. 7B shows an example of terminal protection circuit according to some embodiments of the present invention.

Referring to FIG. 7A. In some embodiments, the terminal protection circuit 204 may comprise a capacitor C1 having a first end connected to the terminal T1 of the terminal protection circuit 204; and a plurality of diodes $D_{TP1\_1}, \ldots, D_{TP1\_M1}$ connected in series between the capacitor C1 and the terminal T2 of the terminal protection circuit 204, where M1 is the number of diodes $D_{TP1}$. More specifically, the plurality of diodes $D_{TP1\_1}, \ldots, D_{TP1\_M1}$ include a first member diode $D_{TP1\_1}$ having an anode connected to a second end of the capacitor C1 and a last member diode $D_{TP1\_M1}$ having a cathode connected to the terminal T2 of the terminal protection circuit 204.

Referring to 7B. In some embodiments, each of the diodes $D_{TP1\_1}, \ldots, D_{TP1\_M1}$ may be constituted (or replaced) with a transistor having a source and a gate electrically shorted together to act as the anode of the diode and a drain to act as the cathode of the diode. In other words, the plurality of diodes $D_{TP1\_1}, \ldots, D_{TP1\_M1}$ may be replaced with a plurality of transistors $Q_{TP1\_1}, \ldots, Q_{TP1\_M1}$. Each of the transistors $Q_{TP1\_1}, \ldots, Q_{TP1\_M1}$ has a source and a gate electrically shorted together. The plurality of transistor $Q_{TP1\_1}, \ldots, Q_{TP1\_M1}$ are connected in series. The plurality of transistor $Q_{TP1\_1}, \ldots, Q_{TP1\_M1}$ include a first member transistor $Q_{TP1\_1}$ having a source and a gate connected to the second end of the capacitor C1 and a last member transistor $Q_{TP1\_M1}$ having a drain connected to the terminal T2 of the terminal protection circuit 204.

Figure 8A:
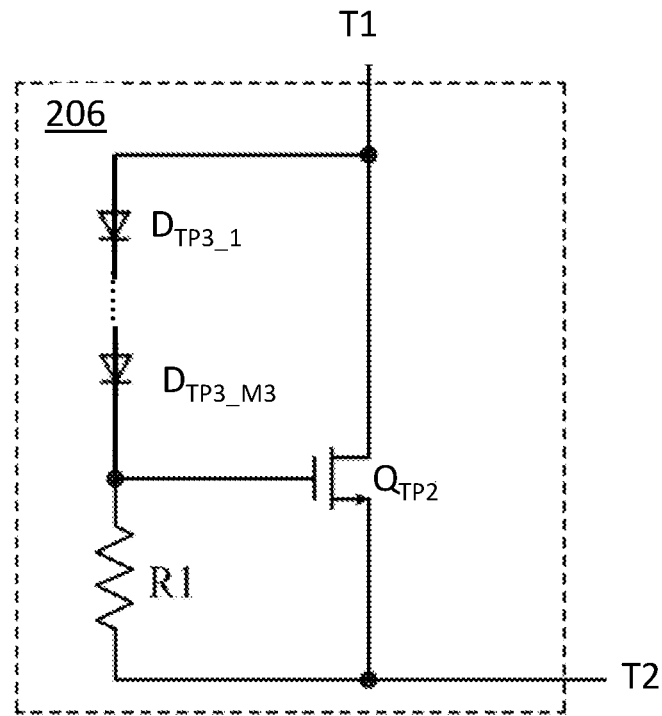
FIG. 8A shows an example of terminal protection circuit according to some embodiments of the present invention.

Referring to FIG. 8A. In some embodiments, the terminal protection circuit 206 may comprise a transistor $Q_{TP2}$ having a drain connected to the terminal T1 of the terminal protection circuit 206 and a source connected to the terminal T2 of the terminal protection circuit 206; a resistor R1 having a first end connected to a gate of the transistor $Q_{ESD2}$ and a second end connected to the terminal T2 of the terminal protection circuit 206; and a plurality of third diodes $D_{TP3\_1}, \ldots, D_{TP3\_M3}$ connected in series between the terminal T1 of the terminal protection circuit 206 and the gate of the transistor $Q_{ESD2}$, where M3 is the number of diodes $D_{TP3}$. More specifically, the plurality of third diodes $D_{TP3\_1}, \ldots, D_{TP3\_M3}$ include a first member diode $D_{TP3\_1}$ having an anode connected to the terminal T1 of the terminal protection circuit 206 and a last member diode $D_{TP3\_M3}$ having a cathode connected to the gate of the transistor $Q_{ESD2}$.

Figure 8B:
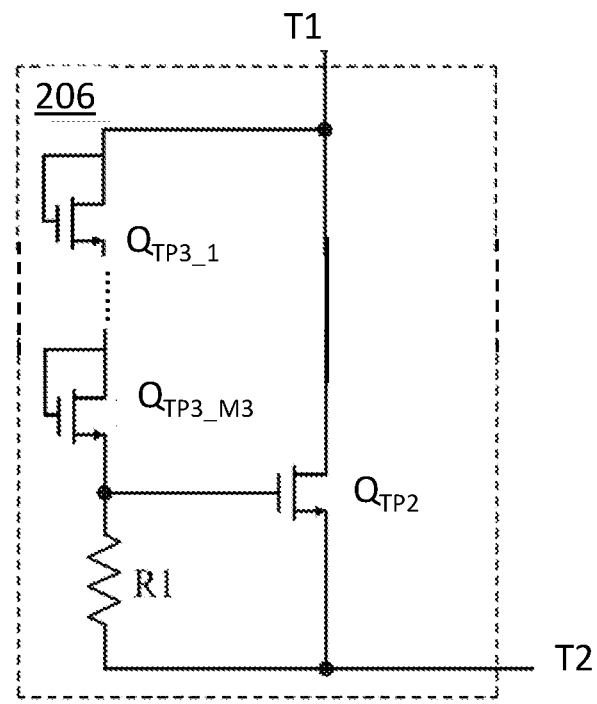
FIG. 8B shows an example of terminal protection circuit according to some embodiments of the present invention.

Referring to FIG. 8B. In some embodiments, each of the third diodes $D_{TP3\_1}, \ldots, D_{TP3\_M3}$ may be constituted (or replaced) with a transistor having a source and a gate electrically shorted together to act as the anode of the diode and a drain to act as the cathode of the diode. In other words, the plurality of diodes $D_{TP3\_1}, \ldots, D_{TP3\_M3}$ may be replaced with a plurality of transistors $Q_{TP3\_1}, \ldots, Q_{TP3\_M3}$. Each of the transistors $Q_{TP3\_1}, \ldots, Q_{TP3\_M3}$ has a source and a gate electrically shorted together. The plurality of transistor $Q_{TP3\_1}, \ldots, Q_{TP3\_M3}$ are connected in series. The plurality of transistor $Q_{TP3\_1}, \ldots, Q_{TP3\_M3}$ include a first member transistor $Q_{TP3\_1}$ having a source and a gate connected to the terminal T1 of the terminal protection circuit 206 and a last member transistor $Q_{TP3\_M3}$ having a drain connected to the gate of the transistor $Q_{ESD2}$.

Figure 9A:
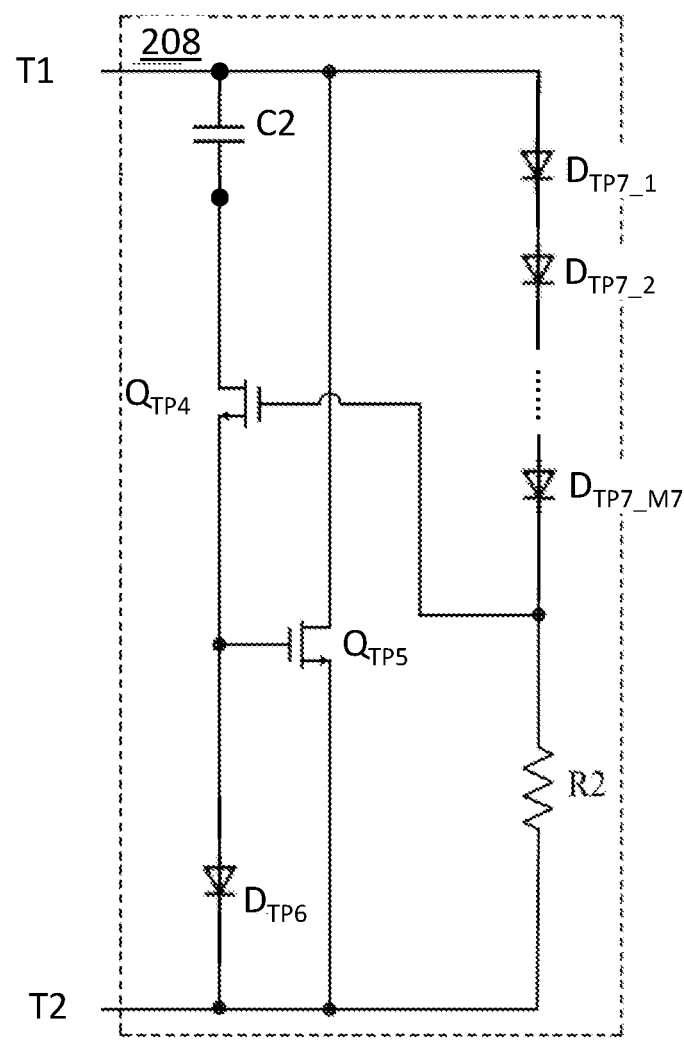
FIG. 9A shows an example of terminal protection circuit according to some embodiments of the present invention.

Referring to FIG. 9A. In some embodiments, the terminal protection circuit 208 may comprise a capacitor C2 having a first end connected to the terminal T1 of the terminal protection circuit 208; a transistor $Q_{TP4}$ having a drain connected to a second end of the capacitor C2; a transistor $Q_{TP5}$ having a gate connected to a source of the transistor $Q_{TP4}$, a drain connected to the terminal T1 of the terminal protection circuit 208, and a source connected to the terminal T2 of the terminal protection circuit 208; a diode $D_{TP6}$ having an anode connected to the gate of the transistor $Q_{TP5}$ and a cathode connected to the terminal T2 of the terminal protection circuit 208; a resistor R2 having a first end connected to a gate of the transistor $Q_{TP4}$ and a second end connected to the terminal T2 of the terminal protection circuit 208; and a plurality of diodes $D_{TP7\_1}, \ldots, D_{TP7\_M7}$ connected in series and including a first member diode having an anode connected to the terminal T1 of the terminal protection circuit 208 and a last member diode connected to the first end of the resistor R2, where, where M7 is the number of diodes $D_{TP7}$.

Figure 9B:
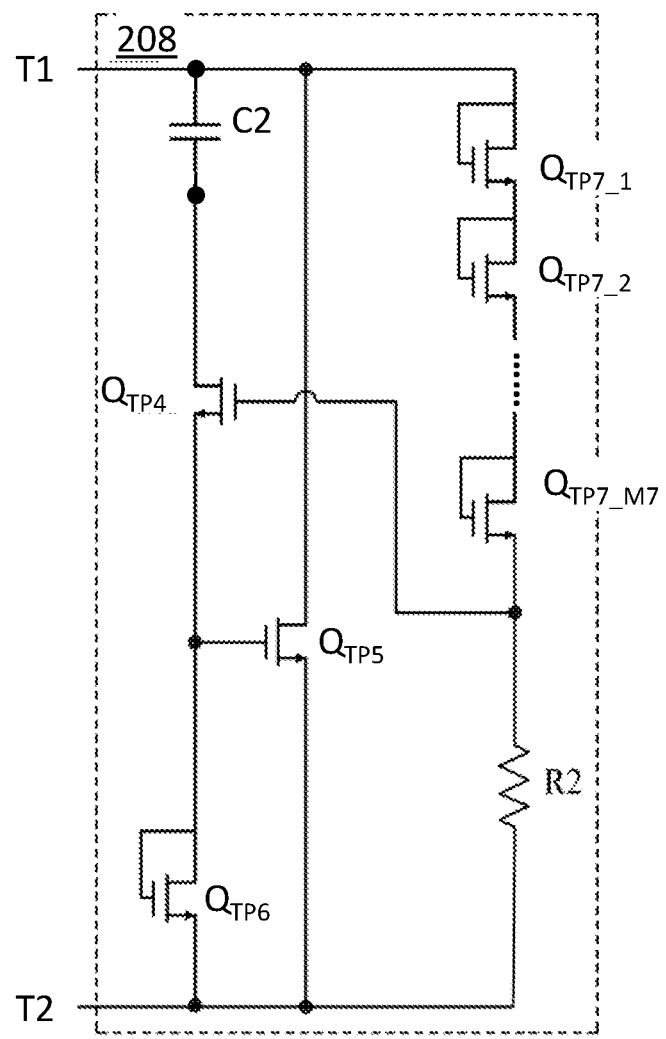
FIG. 9B shows an example of terminal protection circuit according to some embodiments of the present invention.

Referring to FIG. 9B. In some embodiments, each of the diodes $D_{TP7\_1}, \ldots, D_{TP7\_M7}$ may be constituted (or replaced) with a transistor having a source and a gate electrically shorted together to act as the anode of the seventh diode and a drain to act as the cathode of the seventh diode. In other words, the plurality of diodes $D_{TP7\_1}, \ldots, D_{TP7\_M7}$ may be replaced with a plurality of transistors $Q_{TP7\_1}, \ldots, Q_{TP7\_M7}$. Each of the transistors $Q_{TP7\_1}, \ldots, Q_{TP7\_M7}$ has a source and a gate electrically shorted together. The plurality of transistors $Q_{TP7\_1}, \ldots, Q_{TP7\_M7}$ are connected in series. The plurality of transistors $Q_{TP7\_1}, \ldots, Q_{TP7\_M7}$ include a first member transistor $Q_{TP7\_1}$ having a source and a gate connected to the terminal T1 of the terminal protection circuit 208 and a last member transistor $Q_{TP7\_M7}$ having a drain connected to the first end of the resistor R2.

Figure 10:
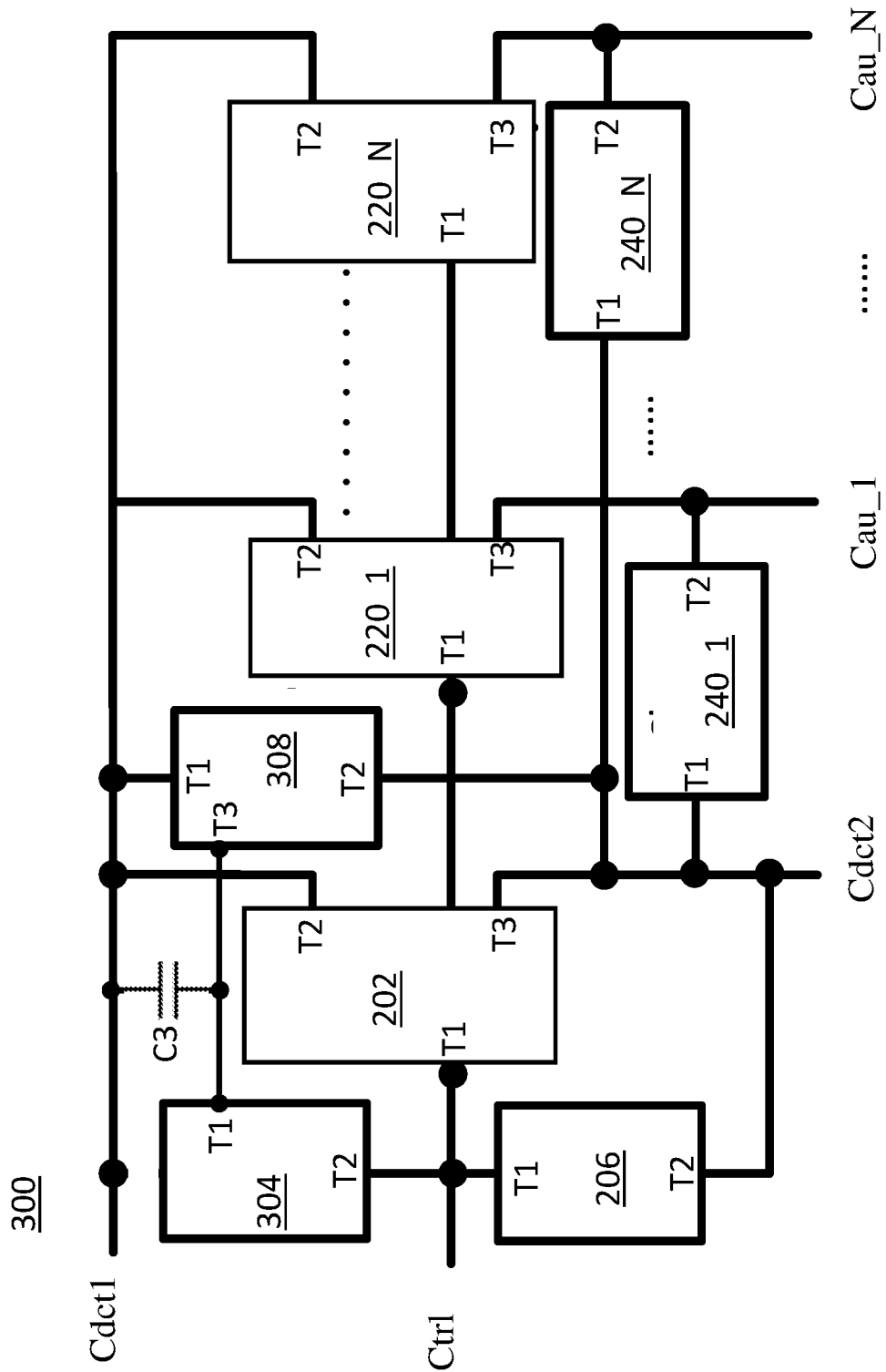
FIG. 10 shows a circuit block diagram for an electronic device according to some embodiments of the present invention.

FIG. 10 is a circuit block diagram for an electronic device 300 according to other embodiments of the present invention. The electronic device 300 is similar to the electronic device 100 except for that the electronic device 300 further a coupling capacitor C3 having a first end connected to the conduction terminal Cdct1, and a second end jointly coupled to two terminal protection circuits 304, 308. The terminal protection circuit 304 has a terminal T1 connected to a second end of the coupling capacitor C3 and a terminal T2 connected to the control terminal Ctrl. The terminal protection circuit 308 has a terminal T1 connected to the conduction terminal Cdct1, a terminal T2 connected to the conduction terminal Cdct2 and a terminal T3 connected to the second end of the coupling capacitor C3.

Figure 11A:
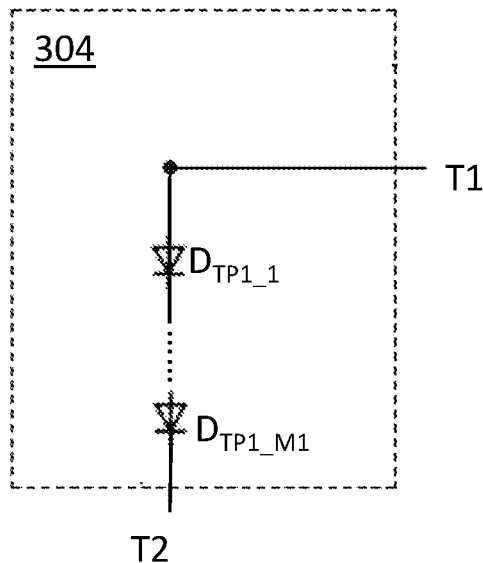
FIG. 11A shows an example of terminal protection circuit according to some embodiments of the present invention.

Referring to FIG. 11A. In some embodiments, the terminal protection circuit 304 may comprise a plurality of diodes $D_{TP1\_1}, \ldots, D_{TP1\_M1}$ connected in series and including a first member diode having an anode connected to the terminal T1 of the terminal protection circuit 304 and a last member diode having a cathode connected to the terminal T2 of the terminal protection circuit 304.

Figure 11B:
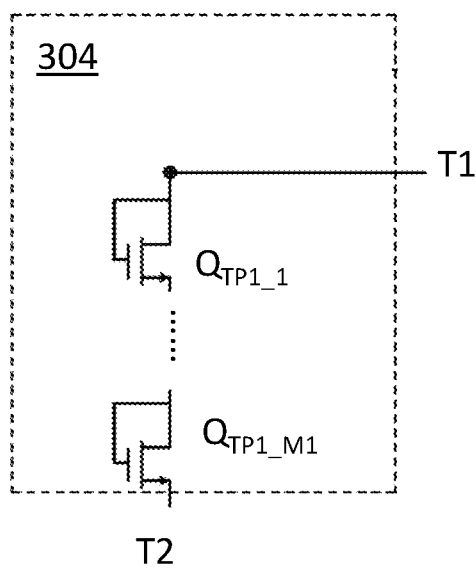
FIG. 11B shows an example of terminal protection circuit according to some embodiments of the present invention.

Referring to FIG. 11B. In some embodiments, each of the diodes $D_{TP1\_1}, \ldots, D_{TP1\_M1}$ may be constituted (or replaced) with a transistor having a source and a gate electrically shorted together to act as the anode of the diode and a drain to act as the cathode of the diode. In other words, the plurality of diodes $D_{TP1\_1}, \ldots, D_{TP1\_M1}$ may be replaced with a plurality of transistors $Q_{TP1\_1}, \ldots, Q_{TP1\_M1}$. Each of the transistors $Q_{TP1\_1}, \ldots, Q_{TP1\_M1}$ has a source and a gate electrically shorted together. The plurality of transistor $Q_{TP1\_1}, \ldots, Q_{TP1\_M1}$ are connected in series. The plurality of transistor $Q_{TP1\_1}, \ldots, Q_{TP1\_M1}$ include a first member transistor $Q_{TP1\_1}$ having a source and a gate connected to the second end of the capacitor C1 and a last member transistor $Q_{TP1\_M1}$ having a drain connected to the terminal T2 of the terminal protection circuit 304.

Figure 12A:
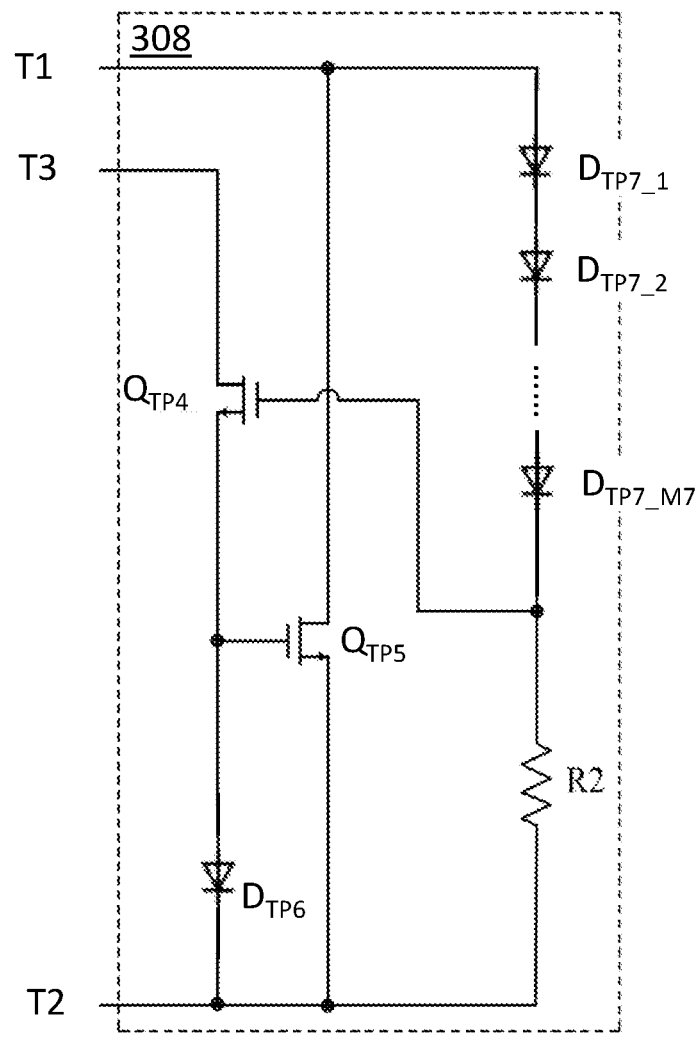
FIG. 12A shows an example of terminal protection circuit according to some embodiments of the present invention.

Referring to FIG. 12A. In some embodiments, the terminal protection circuit 308 may comprise a transistor $Q_{TP4}$ having a drain connected to the terminal T3 of terminal protection circuit 308; a transistor $Q_{TP5}$ having a gate connected to a source of the transistor $Q_{TP4}$, a drain connected to the terminal T1 of terminal protection circuit 308, and a source connected to the terminal T2 of terminal protection circuit 308; a diode $D_{TP6}$ having an anode connected to the gate of the transistor $Q_{TP5}$ and a cathode connected to the terminal T2 of terminal protection circuit 308; a resistor R2 having a first end connected to a gate of the transistor $Q_{TP4}$ and a second end connected to the terminal T2 of terminal protection circuit 308; and a plurality of diodes $D_{TP7\_1}, \ldots, D_{TP7\_M7}$ connected in series and including a first member diode having an anode connected to the terminal T1 of terminal protection circuit 308 and a last member diode connected to the first end of the resistor R2.

Figure 12B:
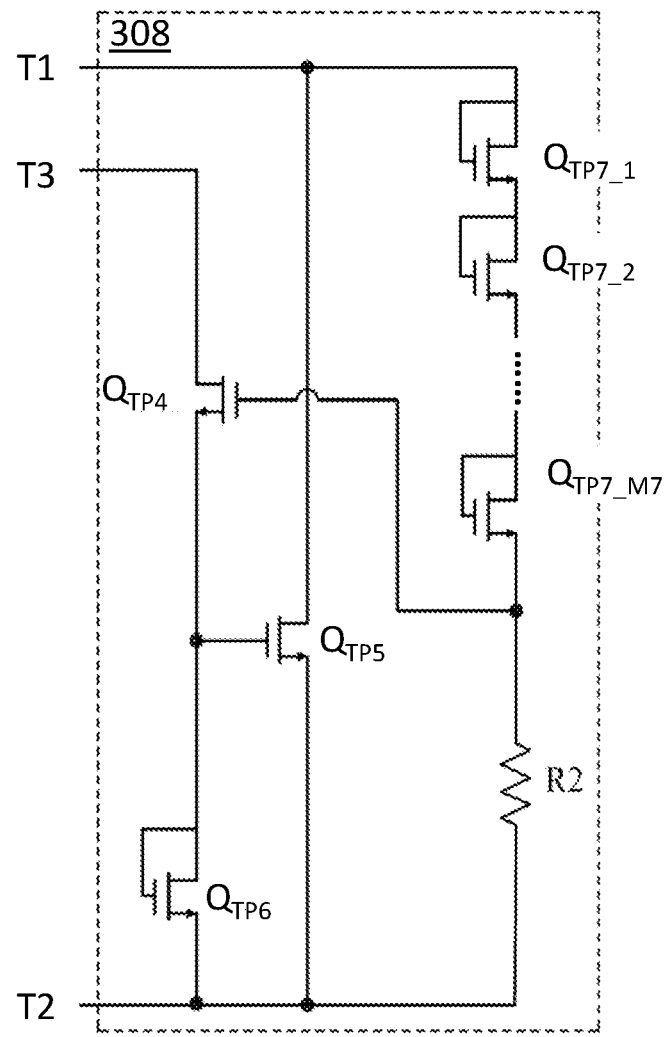
FIG. 12B shows an example of terminal protection circuit according to some embodiments of the present invention.

Referring to FIG. 12B. In some embodiments, each of the diodes $D_{TP7\_1}, \ldots, D_{TP7\_M7}$ may be constituted (or replaced) with a transistor having a source and a gate electrically shorted together to act as the anode of the seventh diode and a drain to act as the cathode of the seventh diode. In other words, the plurality of diodes $D_{TP7\_1}, \ldots, D_{TP7\_M7}$ may be replaced with a plurality of transistors $Q_{TP7\_1}, \ldots, Q_{TP7\_M7}$. Each of the transistors $Q_{TP7\_1}, \ldots, Q_{TP7\_M7}$ has a source and a gate electrically shorted together. The plurality of transistors $Q_{TP7\_1}, \ldots, Q_{TP7\_M7}$ are connected in series. The plurality of transistors $Q_{TP7\_1}, \ldots, Q_{TP7\_M7}$ include a first member transistor $Q_{TP7\_1}$ having a source and a gate connected to the terminal T1 of the terminal protection circuit 308 and a last member transistor $Q_{TP7\_M7}$ having a drain connected to the first end of the resistor R2.

Figure 13:
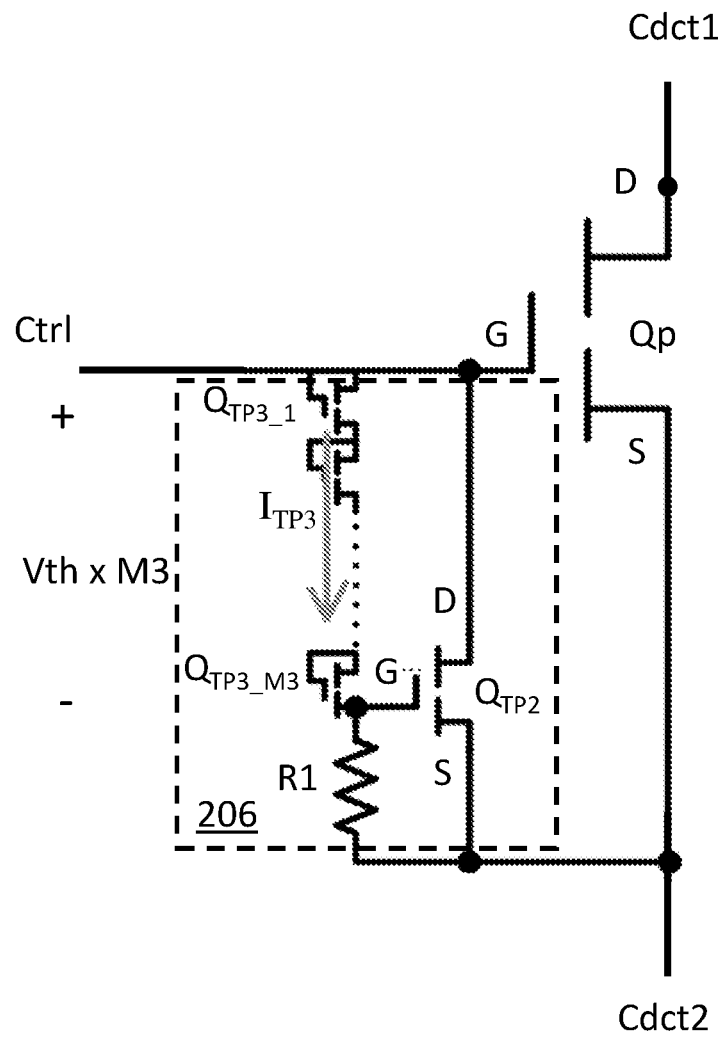
FIG. 13 shows how a primary transistor is protected by a terminal protection circuit according to one embodiment of the present invention.

FIG. 13 shows how the primary transistor Qp is protected by the terminal protection circuit 206. As shown in FIG. 13, the gate-source voltage of the transistor $Q_{TP2}$ is given by $$Vgs\_{TP2} = Vgs\_p - M2 * Vth \quad (1)$$

where $Vgs\_{TP2}$ is the gate-source voltage of the transistor $Q_{TP2}$, Vgs_p is the gate-source voltage of the primary transistor Qp and Vth is the threshold voltage of each of the transistors.

According to Eq. (1), if Vgs_p is higher than (M3+1)*Vth, $Vgs\_{TP2}$ will be higher than Vth. $Q_{TP2}$ will be turned on such that the voltage at the gate of the primary transistor Qp will be pulled down. In other words, the gate of the primary transistor Qp can be protected from any voltage higher than (M3+1)*Vth.

Figure 14:
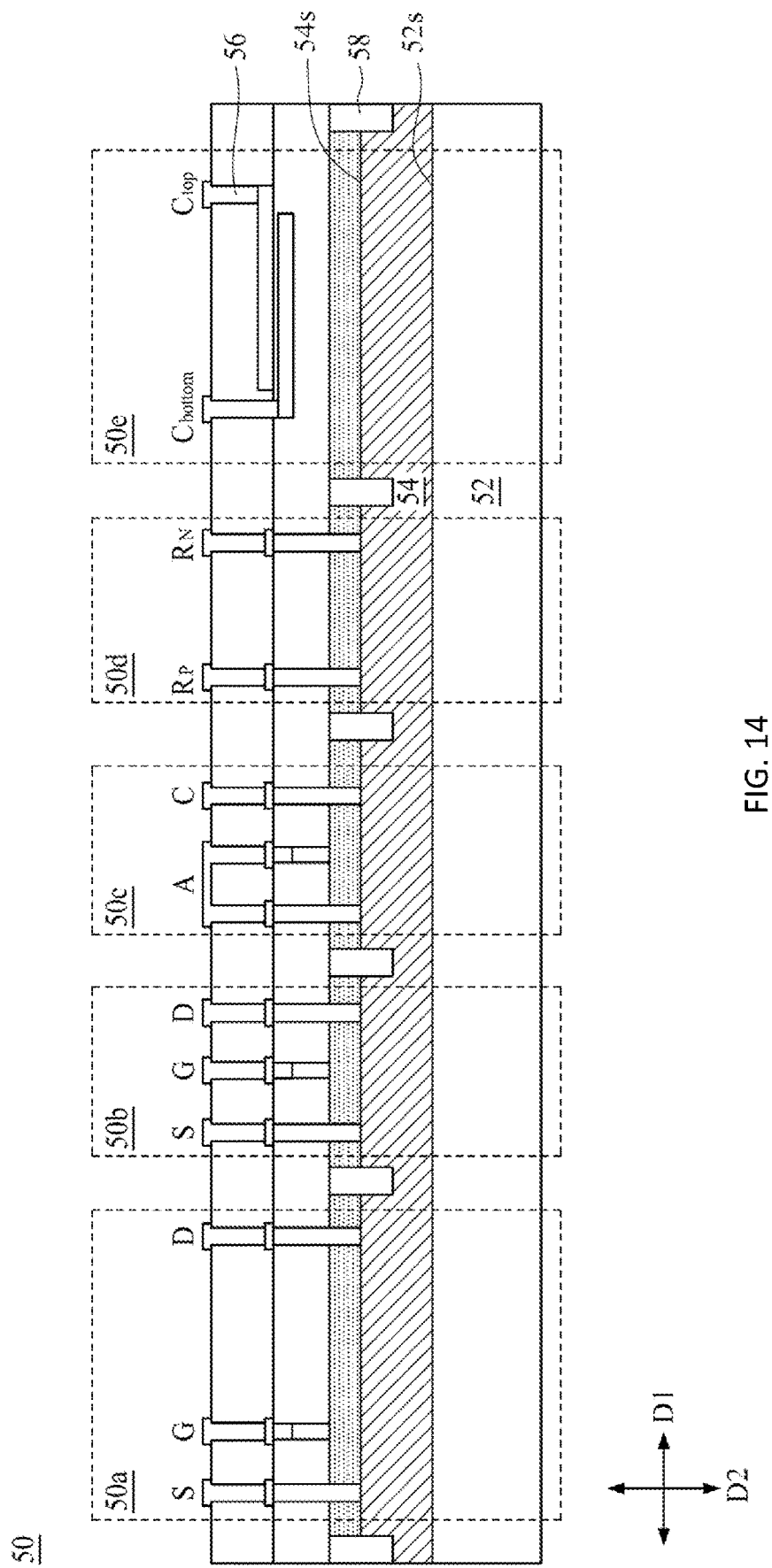
FIG. 14 shows a cross sectional view of an IC chip 50 for forming an electronic device according to some embodiments of the present invention.

The electronic device 100/200/300 according to the present invention may be integrated as an integrated circuit chip. FIG. 14 shows a cross sectional view of an IC chip 50 for forming the electronic device 100/200/300 according to the present invention. As shown, the IC chip 50 may include a substrate 52, an III-V layer 54 and conductor structures 56.

The substrate 52 may include, for example, but not limited to, silicon (Si), doped silicon (doped Si), silicon carbide (SiC), silicide germanium (SiGe), gallium arsenide (GaAs) or other semiconductor materials. The substrate 52 may include, for example, but not limited to, sapphire, silicon on insulator (SOI) or other proper materials. In some embodiments, the substrate 52 may also include a doped region (not shown), for example, a p-well and an n-well.

The III-V layer 54 may be arranged on the substrate 52. The III-V layer 54 may include, for example, but not limited to, gallium nitride (GaN), aluminum gallium nitride (AlGaN), indium gallium nitride (InGaN) and other III-V compounds. In some embodiments, the III-V layer 54 may include, for example, but not limited to, III nitrides, for example, compound InxAlyGa1-x-yN (wherein x+y≤1), compound AlyGa(1-y)N (wherein y≤1). In some embodiments, the III-V layer 54 may include, for example, but not limited to, a p type dopant, an n type dopant or other dopants. In some embodiment, the III-V layer 54 may include a single-layer structure, a multi-layer structure and/or a heterostructure. The III-V layer 54 may have a heterojunction, and two-dimensional electron gas (2DEG) regions (not shown) are formed in the III-V layer 54 due to polarization of heterojunctions of different nitrides.

The conductor structure 56 is arranged on the III-V layer 54. The conductor structure 56 may include metals, for example, but not limited to, titanium (Ti), Tantalum (Ta), tungsten (W), aluminum (Al), cobalt (Co), cuprum (Cu), nickel (Ni), platinum (Pt), plumbum (Pb), molybdenum (Mo) and compounds (for example but not limited to, titanium nitride (TiN), tantalum nitride (TaN), other conductive nitrides or conductive oxides) thereof, metal alloys (for example aluminum copper alloy (Al—Cu)), or other proper materials.

In some embodiments, the conductor structures 56 may include transistor gate G, transistor source S, transistor drain D, rectifier anode A, rectifier cathode C, capacitor terminals $C_{bottom}$ and $C_{top}$, resistor terminals $R_p$ and $R_N$, or other conductor structures.

The conductor structures 56 may form different components of the electronic devices according to various embodiments of the present invention, such as transistors 50a and 50b, rectifier 50c, resistor 50d and capacitor 50e. The electronic device 50 may also include an insulation region 58 isolating various components. The electronic device 300 may be formed by integrating the primary component 102, the auxiliary components, the clamping circuits, the coupling capacitor C3 and at least one of the terminal protection circuits 304, 206 and 308 into an integrated circuit IC chip.

Although the conductor structures 56 and various components formed by the conductor structures 56 are described as being arranged at specific positions in FIG. 14, selection, configuration and quantity of the conductor structures 56 and various components can vary depending on design specifications.

In some embodiments, the transistors 50a and 50b may include high-electron-mobility transistors (HEMT), wherein the HEMT may include an enhancement mode HEMT (E-HEMT) and a depletion mode HEMT (d-HEMT). In some embodiments, the transistor 50a may have a relative high voltage (for example a voltage between the gate and the drain) component (for example a component which is applicable to a voltage of equal to or larger than 600 V) and relative low voltage component (for example a component which is applicable to a voltage of 10 V-100 V). For example, the primary component 102 may be formed of a transistor 50a and each of auxiliary components 120_1/ . . . /120_N may be formed of a transistor 50b.

In some embodiments, the resistor 50d may be a 2DEG resistor. In some embodiments, the resistor 50d may have a 2DEG region. In some embodiments, the capacitor 50e may be a metal-insulator-metal MIM capacitor.

In some embodiments, the electronic device 50 may be a horizontal/transverse electronic device. That is, the components in the electronic device 50 are of horizontal/transverse structures. For example, an arrow D1 is horizontal. The arrow D1 is transverse. An arrow D2 is vertical. The arrow D2 is longitudinal. The arrow D1 is vertical to the arrow D2. The vertical direction is the stacking direction of the substrate 52 and the III-V layer 54 of the electronic device 50. The horizontal direction is roughly parallel to the surface 52s of the substrate 52 and the surface 54s of the III-V layer 54. The current flows in a direction shown by the arrow D1 in FIG. 1. The current flow direction is parallel to the surface 54s of the III-V layer 54. The current flow direction is parallel to the surface 52s of the substrate 52.

Accordingly, the transistors 50a and 50b may include horizontal/transverse HEMTs. That is, as shown in FIG. 14, the electronic device 50 includes gate G, source S and drain D which are horizontally arranged on the surface of the substrate 52. In some embodiments, the current flow directions of the transistors 50a and 50b are parallel to the surface of the structure. In some embodiments, in the transistors 50a and 50b, current flows horizontally or laterally between the drain D and the source S.

In other embodiments, the electronic device 100/200/300 according to the present invention may be formed of discrete electronic devices. That is, the components in the electronic device 100/200/300 are each formed independently in a die. The discrete electronic devices are conducive to formation of integrated electronic devices. For example, the discrete electronic devices are further integrated with other devices, and/or a plurality of electronic devices are integrated with each other.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. An electronic device, comprising:
a control terminal; a first conduction terminal; a second conduction terminal; and one or more auxiliary conduction terminals;
a primary component having three terminals including a first terminal connected to the control terminal, a second terminal connected to the first conduction terminal and a third terminal connected to the second conduction terminal;
one or more auxiliary components, each having three terminals including a first terminal connected to the control terminal, a second terminal connected to the first conduction terminal and a third terminal connected to a corresponding auxiliary conduction terminal;
a terminal protection network for protecting the primary component and the one or more auxiliary components;
the terminal protection network comprises:
one or more terminal protection circuits, each having at least two terminals connected to at least two of three terminals of the primary component respectively; and
one or more clamping circuits, each having a first terminal connected to the second conduction terminal and a second terminal connected to a corresponding auxiliary conduction terminal;
wherein the terminal protection network includes a third terminal protection circuit having a first terminal connected to the first conduction terminal and a second terminal connected to the second conduction terminal;
wherein the third terminal protection circuit comprises:
a second capacitor having a first end connected to the first terminal of the third terminal protection circuit;
a fourth transistor having a drain connected to a second end of the second capacitor;
a fifth transistor having a gate connected to a source of the fourth transistor, a drain connected to the first terminal of the third terminal protection circuit, and a source connected to the second terminal of the third terminal protection circuit;
a sixth diode having an anode connected to the gate of the fifth transistor and a cathode connected to the second terminal of the third terminal protection circuit;
a second resistor having a first end connected to a gate of the fourth transistor and a second end connected to the second terminal of the third terminal protection circuit; and
a plurality of seventh diodes connected in series and including a first member diode having an anode connected to the first terminal of the third terminal protection circuit and a last member diode connected to the first end of the second resistor.

2. The electronic device according to claim 1, wherein each of the clamping circuits comprises:
a first clamping diode having an anode connected to the first terminal of the clamping circuit and a cathode connected to the second terminal of the clamping circuit; and
a second clamping diode having an anode connected to the second terminal of the clamping circuit and a cathode connected to the first terminal of the clamping circuit.

3. The electronic device according to claim 1, wherein each of the clamping circuits comprises:
a plurality of first clamping diodes connected in series and including a first member diode having an anode connected to the first terminal of the clamping circuit and a last member diode having a cathode connected to the second terminal of the clamping circuit; and
a plurality of second clamping diodes connected in series and including a first member diode having an anode connected to the second terminal of the clamping circuit and a last member diode having a cathode connected to the first terminal of the clamping circuit.

4. The electronic device according to claim 1, wherein the terminal protection network includes a first terminal protection circuit having a first terminal connected to the first conduction terminal and a second terminal connected to the control terminal.

5. The electronic device according to claim 4, wherein the first terminal protection circuit comprises:
a first capacitor having a first end connected to the first terminal of the first terminal protection circuit; and
a plurality of first diodes connected in series and including a first member diode having an anode connected to a second end of the first capacitor and a last member diode having a cathode connected to the second terminal of the first terminal protection circuit.

6. The electronic device according to claim 1, wherein the terminal protection network includes a second terminal protection circuit having a first terminal connected to the control terminal and a second terminal connected to the second conduction terminal.

7. The electronic device according to claim 6, wherein the second terminal protection circuit comprises:
a second transistor having a drain connected to the first terminal of the second terminal protection circuit and a source connected to the second terminal of the second terminal protection circuit;
a first resistor having a first end connected to a gate of the second transistor and a second end connected to the second terminal of the second terminal protection circuit; and
a plurality of third diodes connected in series and including a first member diode having an anode connected to the first terminal of the second terminal protection circuit and a last member diode having a cathode connected to the gate of the second transistor.

8. The electronic device according to claim 1, wherein the primary component, the one or more auxiliary components, the one or more clamping circuits and the terminal protection network are integrated into an integrated circuit (IC) chip.

9. An electronic device, comprising:
a control terminal; a first conduction terminal; a second conduction terminal; and one or more auxiliary conduction terminals;
a primary component having three terminals including a first terminal connected to the control terminal, a second terminal connected to the first conduction terminal and a third terminal connected to the second conduction terminal;
one or more auxiliary components, each having three terminals including a first terminal connected to the control terminal, a second terminal connected to the first conduction terminal and a third terminal connected to a corresponding auxiliary conduction terminal;
a terminal protection network for protecting the primary component and the one or more auxiliary components;
the terminal protection network comprises:
one or more terminal protection circuits, each having at least two terminals connected to at least two of three terminals of the primary component respectively; and
one or more clamping circuits, each having a first terminal connected to the second conduction terminal and a second terminal connected to a corresponding auxiliary conduction terminal;
wherein the electronic device further comprises a coupling capacitor having a first end connected to the first conduction terminal; and wherein the terminal protection network includes:
a first terminal protection circuit having a first terminal connected to a second end of the coupling capacitor and a second terminal connected to the control terminal;
a second terminal protection circuit having a first terminal connected to the control terminal and a second terminal connected to the second conduction terminal; and
a third terminal protection circuit having a first terminal connected to the first conduction terminal, a second terminal connected to the second conduction terminal and a third terminal connected to the second end of the coupling capacitor.

10. The electronic device according to claim 9, wherein the first terminal protection circuit comprises a plurality of first diodes connected in series and including a first member diode having an anode connected to the first terminal of the first terminal protection circuit and a last member diode having a cathode connected to the second terminal of the first terminal protection circuit.

11. The electronic device according to claim 9, wherein the second terminal protection circuit comprises:
a second transistor having a drain connected to the first terminal of the second terminal protection circuit and a source connected to the second terminal of the second terminal protection circuit;
a first resistor having a first end connected to a gate of the second transistor and a second end connected to the second terminal of the second terminal protection circuit; and
a plurality of third diodes connected in series and including a first member diode having an anode connected to the first terminal of the second terminal protection circuit and a last member diode having a cathode connected to the gate of the second transistor.

12. The electronic device according to claim 9, wherein the third terminal protection circuit comprises:
a fourth transistor having a drain connected to the third terminal of the third terminal protection circuit;
a fifth transistor having a gate connected to a source of the fourth transistor, a drain connected to the first terminal of the third terminal protection circuit, and a source connected to the second terminal of the third terminal protection circuit;
a sixth diode having an anode connected to the gate of the fifth transistor and a cathode connected to the second terminal of the third terminal protection circuit;
a second resistor having a first end connected to a gate of the fourth transistor and a second end connected to the second terminal of the third terminal protection circuit; and
a plurality of seventh diodes connected in series and including a first member diode having an anode connected to the first terminal of the third terminal protection circuit and a last member diode connected to the first end of the second resistor.

13. The electronic device according to claim 9, wherein the primary component, the one or more auxiliary components, the one or more clamping circuits, the coupling capacitor and the terminal protection network are integrated into an integrated circuit (IC) chip.

14. A terminal protection network for protecting an electronic device, comprising:
one or more terminal protection circuits, each having at least two terminals connected respectively to at least two of three terminals of a primary component in the electronic device; and
one or more clamping circuits, each having two terminals connected respectively to the primary component and a corresponding auxiliary component in the electronic device;
wherein the terminal protection network includes a third terminal protection circuit having a first terminal connected to a first conduction terminal and a second terminal connected to a second conduction terminal;
wherein the third terminal protection circuit comprises:
a second capacitor having a first end connected to the first terminal of the third terminal protection circuit;
a fourth transistor having a drain connected to a second end of the second capacitor;
a fifth transistor having a gate connected to a source of the fourth transistor, a drain connected to the first terminal of the third terminal protection circuit, and a source connected to the second terminal of the third terminal protection circuit;
a sixth diode having an anode connected to the gate of the fifth transistor and a cathode connected to the second terminal of the third terminal protection circuit;
a second resistor having a first end connected to a gate of the fourth transistor and a second end connected to the second terminal of the third terminal protection circuit; and
a plurality of seventh diodes connected in series and including a first member diode having an anode connected to the first terminal of the third terminal protection circuit and a last member diode connected to the first end of the second resistor.

15. The terminal protection network according to claim 14, wherein each of the clamping circuits comprises:
- a first clamping diode having an anode connected to a first terminal of the clamping circuit and a cathode connected to the second terminal of the clamping circuit; and
- a second clamping diode having an anode connected to a second terminal of the clamping circuit and a cathode connected to the first terminal of the clamping circuit.

16. The terminal protection network according to claim 15, wherein:
- each of the first clamping diodes is constituted with a first clamping transistor having a source and a gate electrically shorted together to act as the anode of the first clamping diode and a drain to act as the cathode of the first clamping diode; and
- each of the second clamping diodes is constituted with a second clamping transistor having a source and a gate electrically shorted together to act as the anode of the second clamping diode and a drain to act as the cathode of the second clamping diode.

17. The terminal protection network according to claim 14, wherein each of the clamping circuits comprises:
- a plurality of first clamping diodes connected in series and including a first member diode having an anode connected to a first terminal of the clamping circuit and a last member diode having a cathode connected to the second terminal of the clamping circuit; and
- a plurality of second clamping diodes connected in series and including a first member diode having an anode connected to a second terminal of the clamping circuit and a last member diode having a cathode connected to the first terminal of the clamping circuit.

18. The terminal protection network according to claim 17, wherein:
- each of the plurality of first clamping diodes is constituted with a first clamping transistor having a source and a gate electrically shorted together to act as an anode of the first clamping diode and a drain to act as a cathode of the first clamping diode; and
- each of the plurality of second clamping diodes is constituted with a second clamping transistor having a source and a gate electrically shorted together to act as an anode of the second clamping diode and a drain to act as a cathode of the second clamping diode.

* * * * *